(12) United States Patent
Grundl et al.

(10) Patent No.: US 6,424,550 B2
(45) Date of Patent: Jul. 23, 2002

(54) COMPACT HALF-BRIDGE MODULE IN INERT COOLING FLUID

(75) Inventors: Andreas Grundl, Munich; Bernhard Hoffmann, Starnberg, both of (DE)

(73) Assignee: Continental ISAD Electronic Systems GmbH & Co. oHG, Landsberg/Lech (DE)

( * ) Notice: Subject to any disclaimer, the term of this patent is extended or adjusted under 35 U.S.C. 154(b) by 0 days.

(21) Appl. No.: 09/737,712

(22) Filed: Dec. 15, 2000

Related U.S. Application Data

(63) Continuation of application No. PCT/EP99/04176, filed on Jun. 16, 1999.

(30) Foreign Application Priority Data

Jun. 16, 1998 (DE) .......................................... 198 26 731

(51) Int. Cl.[7] .............................. H02M 7/68; H02M 1/00
(52) U.S. Cl. ........................................ 363/141; 363/144
(58) Field of Search ................................ 363/141, 144, 363/146, 98, 17

(56) References Cited

U.S. PATENT DOCUMENTS

| | | | | |
|---|---|---|---|---|
| 3,581,212 A | * | 5/1971 | McMurray | 327/105 |
| 5,132,896 A | | 7/1992 | Nishizawa et al. | 363/144 |
| 5,410,467 A | * | 4/1995 | Smith et al. | 363/131 |
| 5,412,305 A | * | 5/1995 | Jeanneret | 320/17 |
| 5,594,320 A | * | 1/1997 | Pacholok et al. | 320/4 |
| 5,754,028 A | * | 5/1998 | Vezzini | 320/6 |
| 5,804,943 A | * | 9/1998 | Kollman et al. | 320/1 |
| 5,821,729 A | * | 10/1998 | Schmidt et al. | 320/6 |
| 5,951,904 A | * | 9/1999 | Jung et al. | 219/626 |
| 6,072,707 A | * | 6/2000 | Hochgraf | 363/71 |
| 6,087,799 A | * | 7/2000 | Turner | 318/701 |
| 6,150,795 A | * | 11/2000 | Kutkut et al. | 320/118 |

FOREIGN PATENT DOCUMENTS

| | | | |
|---|---|---|---|
| DE | 42 30 510 C1 | 9/1992 | ............ H02M/1/08 |
| EP | 0 469 172 A1 | 2/1992 | .......... H02M/1/088 |
| EP | 0 553 981 A2 | 1/1993 | ........... H01L/25/07 |

* cited by examiner

Primary Examiner—Bao Q. Vu
(74) Attorney, Agent, or Firm—Haverstock & Owens LLP

(57) ABSTRACT

The invention relates to a half-bridge module which is arranged in an electrically insulating cooling liquid and in which two semiconductor switches form a half-bridge; the first semiconductor switch is capable of being connected by its source terminal to a high voltage potential, and the second semiconductor switch is capable of being connected by its drain terminal to a low voltage potential; the drain terminal of each first semiconductor switch is connected to the source terminal of the respective second semiconductor switch; whereby respective first semiconductor switches are arranged with their source terminal on a common first metallic conductor rail which is capable of being connected to the high voltage potential; respective second semiconductor switches are arranged with their source terminal on a second metallic conductor rail constituting the output which is arranged alongside the first conductor rail, spaced therefrom; each second semiconductor switch is connected by its drain terminal to a common third metallic conductor rail which is capable of being connected to the low voltage potential and is arranged alongside the first and second conductor rails, spaced therefrom; a capacitor arrangement having a backup capacitor which is connected to the first and third conductor rails and which overlaps the first and second semiconductor switches in such a manner that the semiconductor switches are spatially located between the corresponding conductor rails and the backup capacitor; a control input having a terminal for connection to the triggering device in the region of a first front side of the conductor rails, and the output having a terminal in the region of a second front side of the second conductor rail.

25 Claims, 3 Drawing Sheets

COMPACT HALF-BRIDGE MODULE IN INERT COOLING FLUID

This application is a continuation of PCT/EP99/04176 filed Jun. 16, 1999.

FIELD OF THE INVENTION

The invention relates to a half-bridge module for the switching of electrical outputs, which is arranged in a housing containing an electrically insulating cooling liquid and in which at least two semiconductor switches are connected in series, forming a half-bridge. Each semiconductor switch comprises a control input for connection to a triggering device. The first semiconductor switch is capable of being connected by its source terminal to a high voltage potential, and the second semiconductor switch is capable of being connected by its drain terminal to a low voltage potential. For the purpose of forming an output, the drain terminal of each first semiconductor switch is connected to the source terminal of the respective second semiconductor switch. In addition, at least one capacitor arrangement is arranged between the high voltage potential and the low voltage potential. Such a half-bridge module is known from German Patent Publication DE-A-42 30 510.

BACKGROUND OF THE INVENTION

Half-bridge arrangements of such a type are used for the purpose of forming inverters for highly diverse fields of application, e.g. for feeding induction machines, permanent-magnet motors and similar applications. (See also, for example, German Patent Publication DE-A-40 27 969).

From U.S. Pat. No. 5,132,896 an inverter arrangement is known which, with a view to reducing the effect of distributed inductances of the conductors that are used for connecting the capacitors and the semiconductor switches, comprises lamellar supply lines having a large area. By this means, large damping capacitors for compensating the line inductances are avoided. In addition, the dissipation of heat can be improved by virtue of the large-area design of the lamellar supply lines. Furthermore, the lamellar supply lines are designed in such a way that the magnitude and the direction of the current flow through the lamellar supply lines minimizes the effect of the distributed inductances.

However, with this inverter arrangement the large-area supply lines serve merely to lessen interfering inductances and are employed as supply lines leading to large electrolytic capacitors.

SUMMARY OF THE INVENTION

In order to increase further the power density of the half-bridge module described in the introduction and in order to make it still more suitable, in particular, for large-scale use the half-bridge module claimed herein has been developed such that respective first semiconductor switches are arranged with their source terminal on a common first metallic conductor rail which is capable of being connected to the high voltage potential, and respective second semiconductor switches are arranged with their source terminal on a common second metallic conductor rail constituting the output, the second conductor rail being arranged alongside the first conductor rail, spaced therefrom. Moreover, each second semiconductor switch is connected by its drain terminal to a common third metallic conductor rail which is capable of being connected to the low voltage potential and is arranged alongside the first and second conductor rails, spaced therefrom. The capacitor arrangement comprises a backup capacitor which is connected to the first and third conductor rails by terminals and which overlaps the first and second semiconductor switches in such a manner that the semiconductor switches are spatially located between the corresponding conductor rails and the backup capacitor. In addition, the control input comprises a terminal for connection to the triggering device in the region of a first front side of the conductor rails, and the output comprises a terminal for connection to an electrical load in the region of a second front side of the second conductor rail located opposite the first front side.

By virtue of the structure, according to the present invention, of the half-bridge module, a particularly compact arrangement is achieved which enables a packaging density that cannot be equalled by previous solutions. As a consequence, the requisite volume of cooling liquid, relative to the total volume, is kept small. Moreover a miniaturization of the overall arrangement is achieved that permits use of the present invention to become very economical in mobile applications. In this regard a significant benefit is further enjoyed by the fact that, by virtue of the structure utilising the third dimension, a spatial separation of the power-conducting lines (or conductor rails) and terminals, on the one hand, and of the triggering lines, on the other hand, is made possible. This considerably enhances immunity to interference. A further significant aspect of the present invention is the modular structure, which permits problem-free expansion and adaptation of the half-bridge module in line with the particular requirements.

In a preferred embodiment the semiconductor switches are constituted by fast-switching, low-loss field-effect transistors (FETs) or by fast-switching, low-loss bipolar transistors with insulated gate terminal (IGBTs). In particular, MOSFETs with integrated freewheeling diodes or additional external freewheeling diodes connected to the transistors in parallel can be employed. These external freewheeling diodes are advantageously arranged in the same manner as the semiconductor switches and in the immediate vicinity of the latter on one of the conductor rails.

Electrically conducting spacers are arranged on the first and third conductor rails, in particular for the mechanical and electrical parallel connection of several half-bridge modules. Hence half-bridge modules of the same type can be rigidly coupled to one another, and at the same time the supply of the high and low potentials to all the half-bridge modules that have been coupled in such a manner can be achieved in a straightforward way. In one embodiment of the present invention the spacers are realised as separate components, with which the respective conductor rails are connected (screw-coupled, riveted, welded etc). As an alternative to this, the spacers may also be integral with the conductor rails, so that the requisite spacing between the individual half-bridge modules comes about and is also kept constant by a direct joining of the respective conductor rails.

In a preferred embodiment of the present invention the first, second and third conductor rails are firmly connected to one another mechanically by an electrically insulating carrier board. As an alternative to this, the first, second and third conductor rails may be firmly connected to one another mechanically by electrically insulating crossmembers which are arranged between the individual conductor rails. The carrier board may also serve to receive conductor tracks in order to supply control signals to the semiconductors or in order to lead out test points or measuring points. The carrier board also serves to receive interconnecting lines between the respective control inputs of the semiconductor switches and the terminal for connection to the triggering device.

In this case the carrier board is preferably provided with recesses which are dimensioned in such a way that the semiconductors (transistors and diodes) that are directly applied on the conductor rails are exposed at least with their contacting points—that is, they are not covered up by the carrier board. This has the result that the effective overall heights of the semiconductors and of the carrier board are not added. Rather, both are connected directly (at the same level) to the conductor rails. Hence the carrier board serves both for the mechanical connection of the conductor rails amongst themselves and for the electrical wiring arrangement. The connection of the conductor tracks that are arranged on the carrier board to the contacting points of the semiconductors is preferably established by bonding wires.

As an alternative to this, instead of the carrier board, an electrically insulating foil is arranged in the conducting rails, with interconnecting lines between the respective control inputs and the terminal for connection to the triggering device. Since a foil is not suitable to establish a mechanically rigid or firm connection between the individual conductor rails, with a view to producing the necessary strength of the conductor-rail arrangement an additional connection should be formed on the lateral faces of the conductor rails facing one another. This can be achieved by means of the aforementioned crossmembers or by means of an electrically insulating adhesive.

In a preferred embodiment of the present invention the electrically insulating carrier board or the foil carries current-limiting resistors in the triggering lines for the semiconductor switches, said (gate) resistors being provided between the respective control inputs and the terminal for connection to the triggering device.

In accordance with the present invention, at least two half-bridge modules of the type described above are assigned to one another mechanically and are electrically connected in parallel in order to form a half-bridge arrangement. By virtue of the modular concept according to the present invention an increase in power output is easily achieved. By a simple parallel connection of an appropriate number of half-bridge modules or an expansion of a half-bridge arrangement through additional half-bridge modules it is also possible to provide a higher power output or to increase the number of phases.

Accordingly, the present invention also relates to a power output stage of a triggering device for a multiphase electric motor, wherein a half-bridge arrangement is provided for each phase of the electric motor, the half-bridge arrangements being arranged alongside one another. In a preferred embodiment of the present invention a power output stage of a triggering device for a multiphase electric motor is provided, a control-electronics module being spatially assigned to the power output stage and arranged in the same housing. By this arrangement both the control-electronics module and the power output stage with their plurality of half-bridge arrangements or half-bridge modules are accommodated in the same cooling medium. This creates a particularly compact structure of a functional overall arrangement, and the control lines may also be routed so as to be very short and rendering them less susceptible to interference.

The semiconductors that are used within the invention are preferably constituted by fast-switching, low-loss field-effect transistors (FETS) or by fast-switching, low-loss bipolar transistors with insulated gate terminal (IGBTs). In this case several pairs of semiconductor switches connected in series may be connected in parallel. In addition, the semiconductor switches may be constituted by a large number of individual semiconductor-switch modules with, in each case, low switching capacities. Through the use of many semiconductor-switch elements with, in each case, a relatively low switching capacity which are, however, easy to connect in parallel, effective cooling can be achieved, since the many individual components can be reached well by the cooling medium.

BRIEF DESCRIPTION OF THE DRAWINGS

A preferred embodiment of the subject-matter of the present invention is illustrated in the drawings.

DETAILED DESCRIPTION OF THE PREFERRED EMBODIMENT

Figure 1:
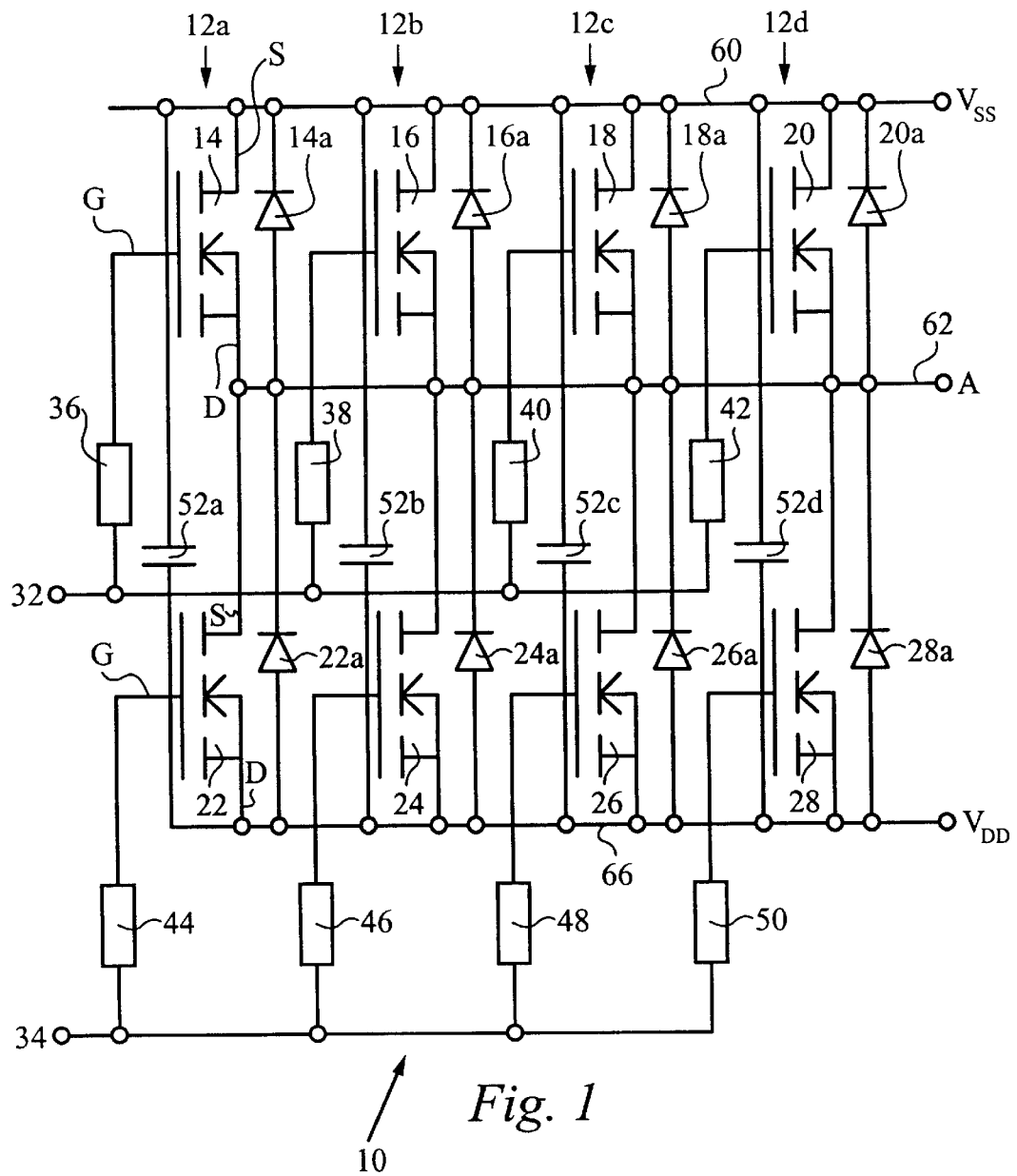
FIG. 1 shows an electrical circuit diagram of a half-bridge.

FIG. 1 shows a half-bridge 10 which comprises four pairs 12a, 12b, 12c, 12d of n-channel MOSFETs connected in parallel which act as semiconductor switches. In each instance two of the MOSFETs 14, 22; 16, 24; 18, 26; 20, 28 which respectively constitute a pair are connected in series. The first MOSFET 14; 16; 18; 20 of each pair is applied by its source terminal to a high voltage potential $V_{SS}$, and each second MOSFET 22; 24; 26; 28 of each pair is applied by its drain terminal to a low voltage potential $V_{DD}$. In this connection, for the purpose of forming an output A, the drain terminal of each of the first MOSFETs 14; 16; 18; 20 and the source terminal of each of the second MOSFETs 22; 24; 26; 28 are connected to one another. A control input 32; 34 is provided for the group of the first MOSFETs 14; 16; 18; 20 and for the group of the second MOSFETs 22; 24; 26; 28, respectively, the gate terminals of the respective MOSFETs being selected via gate resistors 36; 38; 40; 42 and 44; 46; 48; 50, respectively.

Arranged between the high and the low voltage potentials $V_{SS}$ and $V_{DD}$ is a backup-capacitor arrangement which is constituted by individual backup capacitors 52a, 52b, 52c, 52d connected in parallel. The implementation of the capacitor arrangement 52a, 52b, 52c, 52d is described in more detailed manner further below. The triggering of the respective group of MOSFETs is effected with a (pulse-width-modulated) control signal having a switching frequency of more than 20 kHz. The switching frequency preferably amounts to 100 kHz and more.

Figure 2:
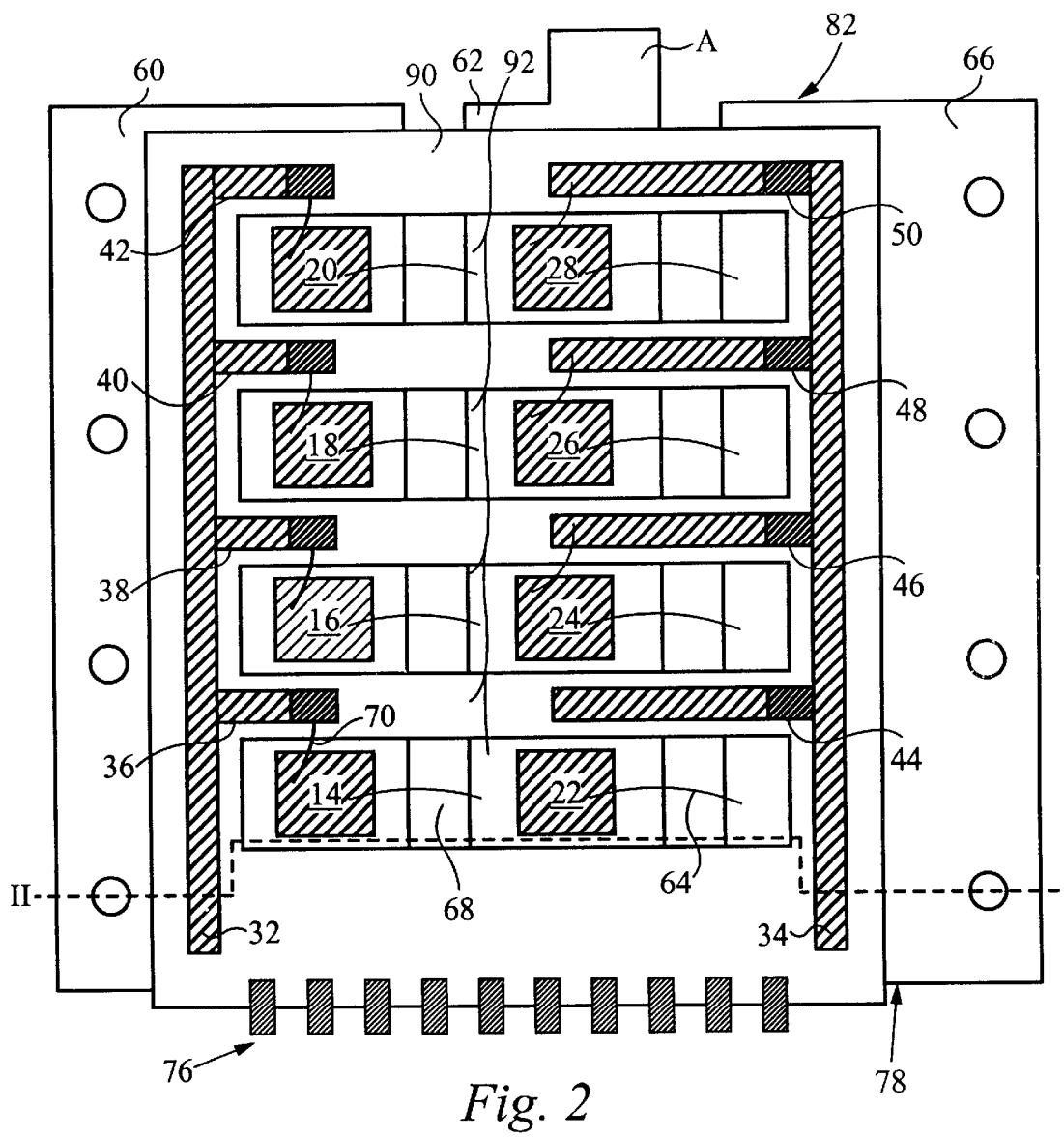
FIG. 2 shows a half-bridge module in a schematic view from above.

As shown in FIG. 2, the first MOSFETs 14; 16; 18; 20 are soldered with their source terminal S on a common first metallic conductor rail 60 which is capable of being connected to the high voltage potential $V_{SS}$. The conductor rail 60 has a profile that is approximately rectangular in cross-section and is produced from copper or some other material, which, like copper, is a good conductor of both heat and electric current.

The second MOSFETs 22; 24; 26; 28 are soldered with their source terminal (S) on a common second metallic conductor rail 62 constituting the output A, the second conductor rail 62 being arranged alongside the first conductor rail 60, spaced therefrom. The second conductor rail 62 also has a profile that is approximately rectangular in cross-section and is produced from the same material as the first conductor rail 60.

The second MOSFETs 22; 24; 26; 28 are respectively connected, via one or more bonding wires 64, by their drain terminals D to a common third metallic conductor rail 66 which is capable of being connected to the low voltage potential $V_{DD}$, the third conductor rail 66 being arranged alongside the second conductor rail 62, spaced therefrom.

The first MOSFETs 14; 16; 18; 20 are respectively connected, via one or more bonding wires 68, by their drain terminals D to the second conductor rail 62.

Figure 3:
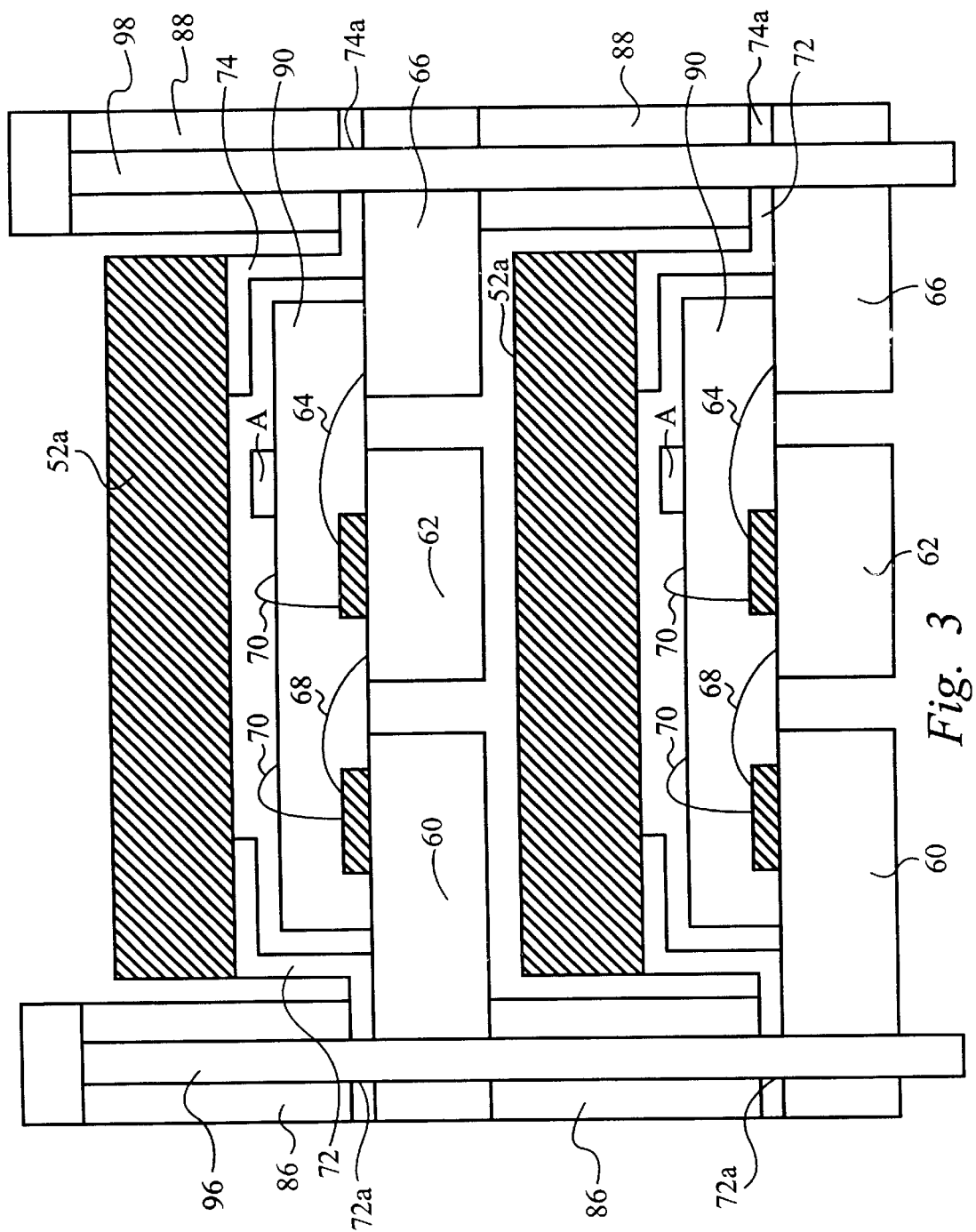
FIG. 3 shows two joined half-bridge modules from FIG. 2 in a schematic sectional representation along line II—II from the front.

The capacitor arrangement 52 is constituted by several block-like foil capacitors 52a . . . 52d which are connected to the first and third conductor rails 60, 66 by step-like connecting plates 72, 74 as shown in FIG. 3. At their free ends the connecting plates 72, 74 exhibit holes 72a, 74a, through which pass screws 96, 98 for fastening the connecting plates 72, 74 between the respective conductor rails and spacers 86, 88. The step-like connecting plates 72, 74 are dimensioned in such a way that the block-like foil capacitors 52a . . . 52d overlap the respective first and second semiconductor switches in such a manner that the semiconductor switches are spatially located between the corresponding conductor rails and the respective block-like foil capacitor. In this case a small spacing is also maintained between the semiconductor switches and the foil capacitor, so that the cooling liquid is able to flow through between them. The spacers 86, 88 are dimensioned in such a way that the foil capacitors do not protrude beyond them.

In the embodiment represented in FIG. 2 the diodes 14a . . . 28a shown in FIG. 1 are understood to be integrated within the MOSFETs and are therefore not shown separately. Otherwise, separate diodes 14a . . . 28a would be soldered alongside the MOSFETs 14 . . . 28, likewise on the first and second conductor rail 60, 62, respectively.

In order to make available a separately producible and manageable unit consisting of a half-bridge module, the first, second and third conductor rails 60, 62, 66 are firmly connected to one another mechanically by an electrically insulating carrier board 90. To this end, the carrier board 90 is affixed to the conductor rails on the same surface as the semiconductor switches. Additionally the carrier board 90 serves, to receive interconnecting lines 32, 34 between the respective control inputs G of the semiconductor switches and the pins of the terminal strip 76 for connection to the triggering device.

As shown in FIG. 2, the respective control inputs G as well as a number of test pins on a terminal strip 76 are led out on the carrier board 90 for connection to a triggering device in the region of a first front side 78 (at the bottom in FIG. 2) of the conductor rails 60, 62, 66, whereas the output A is led out to a terminal 80 for connection to an electrical load in the region of a second front side 82 (at the top in FIG. 2) of the second conductor rail 62 located opposite the first front side 78.

Gate resistors 36 . . . 50 (see FIG. 1) are also arranged on the carrier board 90 as SMD components (surface-mounted devices) between the respective control inputs G of the MOSFETs and the corresponding pins of the terminal strip 76. Connection of the gate resistors to the control inputs G of the MOSFETs is likewise effected via bonding wires 70.

As can be seen in FIG. 2, the carrier board 90 exhibits rectangular recesses 92, through which the semiconductor switches or the diodes protrude. Hence the overall structure is relatively flat.

With a view to forming a half-bridge arrangement, several of the half-bridge modules described above can be firmly connected to one another mechanically and can be electrically connected in parallel. This is illustrated in FIG. 3, wherein two identical half-bridge modules are stacked on top of one another and screw-coupled to one another. As is apparent, the outer conductor rails 60, 66 and also the spacers 86, 88 arranged between them serve for the common supply of current for the semiconductor switches, whereas the outputs A of the individual half-bridge modules are provided separately in series.

The arrangement shown in FIG. 3 can be connected—for each phase of an electrical connection—via the terminal strip 76 (see FIG. 2) to a common control-electronics module so as to form a compact unit which is accommodated in a common housing. In this case the housing is constructed so as to be fluid-tight and contains the inert cooling medium, e.g. a fluorochlorinated hydrocarbon.

It will be readily apparent to one skilled in the art that other various modifications may be made to the preferred embodiment without departing from the spirit and scope of the invention as defined by the appended claims.

What is claimed is:

1. A half-bridge module for switching of electrical power, the half bridge module being arranged in a housing containing an electrically insulating cooling liquid, the half-bridge module comprising:
   a. a plurality of half bridges including a first half-bridge and a second half-bridge, each half bridge comprising at least two semiconductor switches, each semiconductor switch comprising a control input, a source terminal, and a drain terminal, wherein the control input is electrically coupled to a triggering device, a first semiconductor switch and a second semiconductor switch being electrically coupled in series to form each half bridge; wherein
      i. the source terminal of the first semiconductor switch is electrically coupled to a high voltage potential;
      ii. the drain terminal of the second semiconductor switch is electrically coupled to a low voltage potential;
      iii. the drain terminal of the first semiconductor switch is electrically coupled to the source terminal of the second semiconductor switch; and
   b. at least one capacitor arrangement arranged between the high and the low voltage potentials; wherein
      i. the first semiconductor switch is arranged with its source terminal on a common first metallic conductor rail which is electrically coupled with the high voltage potential;
      ii. the second semiconductor switches are arranged with their source terminal on a common second metallic conductor rail, the second conductor rail functioning as an output and arranged alongside the first conductor rail;
      iii. the drain terminal of the second semiconductor switch is electrically coupled with a common third metallic conductor rail which is electrically coupled with the low voltage potential and is arranged alongside the first and second conductor rails;
      iv. the capacitor arrangement comprises a backup capacitor which is electrically coupled between the first and third conductor rails by terminals and which overlaps the first and second semiconductor switches;
      v. a terminal for connecting the control input to the triggering device is located in the region of a first front side of the conductor rails, and
      vi. the output comprises a terminal for connection to an electrical load in the region of a second front side of the second conductor rail located opposite the first front side.

2. The half-bridge module according to claim 1, further comprising electrically conducting spacers arranged on at least one conductor rail selected from a group consisting of the first and third conductor rails.

3. The half-bridge module according to claim 1, wherein the first, second and third conductor rails are firmly connected to one another mechanically by an electrically insulating carrier board.

4. The half-bridge module according to claim 1, wherein the first, second and third conductor rails are firmly connected to one another mechanically by electrically insulating crossmembers which are arranged between the individual conductor rails.

5. The half-bridge module according to claim 4, wherein an electrically insulating foil is arranged on the conductor rails, the electrically insulating foil having electrically conductive interconnecting lines for electrically coupling the respective control inputs to select terminal-strip pins for connection to the triggering device.

6. The half-bridge module according to claim 3, wherein the electrically insulating carrier board comprises electrically conductive interconnecting lines for electrically coupling the respective control inputs with select terminal-strip pins for connection to the triggering device.

7. The half-bridge module according to claim 3 further comprising a plurality of gate resistors operatively coupled with the electrically insulating carrier board wherein the plurality of resistors are electrically disposed between the respective plurality of control inputs and select terminal-strip pins for connection to the triggering device.

8. The half-bridge module according to claim 1, wherein at least two half-bridge modules are electrically connected in parallel.

9. The half bridge module according to claim 8 for use with a multiphase electric motor; wherein at least one half bridge arrangement is assigned to function in conjunction with each phase.

10. The half bridge module according to claim 8 for use with a multiphase electric motor; further comprising a power output stage of a triggering device for a multiphase electric motor, wherein a control-electronics module is spatially assigned to the power output stage and arranged in a same housing.

11. The half-bridge module according to claim 1 wherein the semiconductor switches include a plurality of fast-switching, low-loss transistors selected from a group consisting of field-effect transistors (FETs) and bipolar transistors with insulated gate terminal (IGBTs).

12. The half-bridge module according to claim 1, wherein several pairs of semiconductor switches, each connected in series are connected together in parallel.

13. The half-bridge module according to claim 1 wherein the semiconductor switches include individual semiconductor-switch components with, in each case, low switching capacities.

14. The half-bridge module according to claim 1 wherein the first conductor rail and the second conductor rail are substantially parallel with the third conductor rail.

15. The half bridge module according to claim 1 wherein the backup capacitor is oriented such that a semiconductor switch is spatially disposed between the backup capacitor and a conductor rail.

16. A half-bridge module for switching of electrical power in a space-saving and compact arrangement comprises:
   a. a module housing;
   b. electrically insulating cooling liquid within the module housing;
   c. a plurality of conductor rails within the module housing, including a high-voltage rail, a ground rail and an output rail arranged in a substantially co-planar arrangement within the module housing, wherein the conductor rails are substantially parallel;
   d. a plurality of half-bridges within the module housing, including a first half-bridge and a second half-bridge, each half-bridge module comprised of at least a high-voltage semiconductor switch and a low voltage semiconductor switch, each semiconductor switch being comprised of a source terminal, a drain terminal and a gate terminal, wherein
      i. the source terminal of each high-voltage semiconductor switch is electrically coupled to the high-voltage rail;
      ii. the drain terminal of each high-voltage semiconductor switch is electrically coupled to the output rail;
      iii. the source terminal of each low-voltage semiconductor switch is electrically coupled to the output rail;
      iv. the drain terminal of each low-voltage semiconductor switch is electrically coupled to the low-voltage rail; and
      v. the gate terminal of each semiconductor switch is electrically coupled to a triggering device;
   e. a capacitor arrangement comprising at least one capacitor electrically coupled between the high-voltage rail and the low-voltage rail; and
   f. a plurality of spacers for spacing the plurality of half-bridges within the module housing.

17. The half bridge module of claim 16 wherein the plurality of spacers comprises spacer members affixed to at least one rail of the plurality of rails.

18. The half bridge module of claim 16 wherein the plurality of spacers are integral to the composition of at least of one the plurality of the rails.

19. The half bridge module of claim 18 wherein at least one rail is expandable in connectable segments, each connectable segment defining a spacing for accommodating an additional half-bridge.

20. The half-bridge module of claim 16 further comprising one or more insulators for insulatively maintaining a uniform distance between the plurality of rails.

21. The half-bridge module of claim 20 wherein the one or more insulators comprise an electrically insulating carrier board.

22. The half bridge module according to claim 20 wherein the one or more insulators comprise electrically insulating crossmembers arranged between select conductor rails.

23. The half-bridge module according to claim 16 further comprising a carrier board with recesses for positioning select components within the half-bridge module such that a height of the module is not increased by a measure of the additive value of the carrier board and the select components combined.

24. The half bridge module according to claim 23 wherein the select components embedded within recesses in the module further includes one or more gate resistors each disposed electrically in series between a triggering device and a respective gate terminal.

25. The half-bridge module according to claim 16 further comprising a plurality of output rails for providing phase-differentiated power to a poly-phase device.

* * * * *